US006867971B2

(12) United States Patent
Lai

(10) Patent No.: US 6,867,971 B2
(45) Date of Patent: Mar. 15, 2005

(54) HEAT DISSIPATION APPARATUS

(75) Inventor: Chih-Hsi Lai, Hsin-Tien (TW)

(73) Assignee: Quanta Computer, Inc., Tiawan (CN)

( * ) Notice: Subject to any disclaimer, the term of this patent is extended or adjusted under 35 U.S.C. 154(b) by 73 days.

(21) Appl. No.: 10/338,116

(22) Filed: Jan. 7, 2003

(65) Prior Publication Data

US 2004/0027805 A1 Feb. 12, 2004

(30) Foreign Application Priority Data

Aug. 12, 2002 (TW) ........................ 91212448 U

(51) Int. Cl.⁷ .............................................. H05K 7/20
(52) U.S. Cl. ................ 361/697; 165/80.3; 165/121; 165/104.33; 174/15.2; 257/722; 361/700; 361/703
(58) Field of Search ............... 165/80.2–80.3, 165/104.21, 104.33, 121–122, 126, 185; 174/15.2, 16.3; 257/715, 722; 361/687–703

(56) References Cited

U.S. PATENT DOCUMENTS 6,348,748 B1 * 2/2002 Yamamoto .................. 310/62
6,439,299 B1 * 8/2002 Miyahara et al. ........... 165/121
6,550,529 B1 * 4/2003 Horng et al. ............... 165/80.3

FOREIGN PATENT DOCUMENTS

| JP | 2001-251079 | 9/2001 |
| TW | 471657 | 1/2002 |

* cited by examiner

Primary Examiner—Gregory Thompson

(57) ABSTRACT

A heat dissipation apparatus is described. The heat dissipation apparatus reduces noise of a notebook computer. The apparatus comprises a heat sink, at least one heat pipe, at least one heat column, a plurality of heat exhausting fins, and at least one fan device. The heat sink catches the heat energy on the central processing unit of the notebook computer. The heat energy is transferred from the heat sink to the heat pipes, and then to the heat columns. The heat columns delivers the heat energy to the heat exhausting fins parallel to each other in a vertical direction and the fan device blows the heat out of the computer. The fan device has an outlet angle aligned with an inlet angle of the heat exhausting fins, and therefore the noise of the computer is reduced. In particular, a heat plate is coupled between the heat columns and the heat pipes. Hence, the heat can be more efficiently delivered to the heat exhausting fins directly from sidewalls of the heat exhausting fins and by way of the columns.

18 Claims, 4 Drawing Sheets

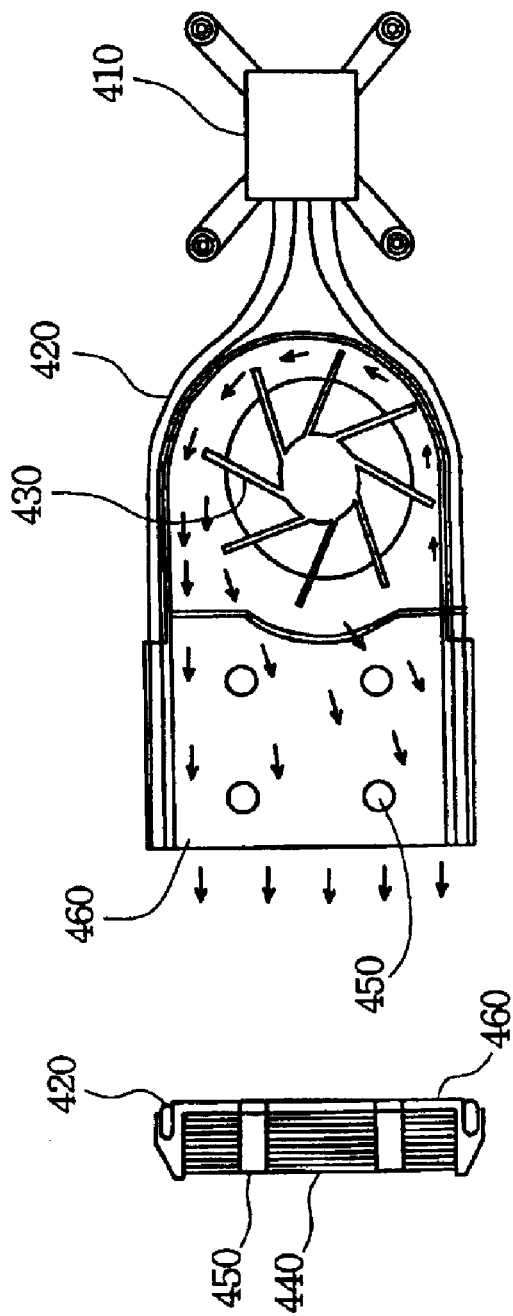
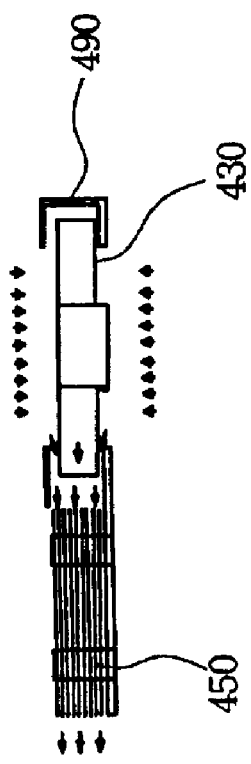
FIG. 4A
FIG. 4B
FIG. 4C

HEAT DISSIPATION APPARATUS

FIELD OF THE INVENTION

The present invention relates to a heat dissipation apparatus and especially to a heat dissipation apparatus for a notebook computer.

BACKGROUND OF THE INVENTION

Information technology and the computer industry are highly developed now. Portable electronic devices, such as a notebook computer, are widely used. Due to weight and practical requirements, portable devices tend to be lighter, thinner, shorter and smaller. The notebook computer is a successful product because the notebook computer with powerful calculation capability deals with a great amount of digital data.

The semiconductor manufacture process has highly progressed. The design of the semiconductor becomes more complicated and more sophisticated on a daily basis due to functional requirements. For example, the electric circuit layout of the central processing unit (CPU) is more complicated because the CPU has to provide enough functions for users and application software. The new generation CPU provides powerful functions and performance but the powerful CPU generates some new problem in use. A serious problem is that the new CPU with a complicated circuit has a higher power consumption and thus severely elevates the temperature of the chips. The high temperature can cause instability in the working system, and especially in a small-sized portable device. In general, a lower work temperature makes a portable device more stable. That is to say, if the notebook computer temperature can be lower, the performance thereof is higher. If the temperature is high, the performance and stability decrease, and the operation system may even crash.

In practice, the notebook computer needs a high powered fan to exhaust internal heat. The high power fan is loud while it is working. The noise comes from not only the fan itself but also the quantity of the magnetic poles, revolutions, blades of the fan, and combinations thereof.

FIG. 1A is a heat dissipation apparatus of a traditional notebook computer. The cooling apparatus includes a heat sink 110, a heat pipe 120, a fan 130, and heat exhausting fins 140. The heat sink 110 collects the heat energy generated from the central processing unit (CPU) of the notebook computer and the heat pipe 120 delivers the heat energy to the heat exhausting fins 140. Then, the fan 130 blows on the heat exhausting fins 140 to carry the heat energy out of the notebook computer.

FIG. 1B shows airflow directions of FIG. 1A. The arrows 150 show the airflows direction inside the fan 130. As the drawing shows, the airflow caused by the rotating fan has directions nearly perpendicular to a line from the center to the contact point on the blade of the fan 130. When the airflow contacts the heat exhausting fins 140, the airflow direction follows the direction of the heat exhausting fins 140. Therefore, angles between the airflow direction, arrows 150, and the heat exhausting fins 140 vary in different positions relative to the fan 130 and the heat exhausting fins 140. When the angle is larger, the exhausting volume is lower and the noise is caused by turbulence in the heat exhausting fins 140 is more serious. Arrow 160 shows volumes of airflow exiting the heat exhausting fins 140. The length of the arrow 160 indicates airflow volume. Therefore, the airflow volume distribution and noise sources are clear.

A high proximity between a notebook computer and a user thereof means that any obvious noise causes the user discomfort. Product image is correspondingly diminished. A quieter cooling apparatus for a notebook computer favors the user and is immediately perceived by the user. Hence, a quieter cooling apparatus makes the notebook computer more comfortable and practical as well as greatly enhancing the product image thereof.

SUMMARY OF THE INVENTION

One object of the present invention is to provide a heat dissipation apparatus with horizontal heat exhausting fins to reduce turbulence and noise.

Another object of the present invention is to provide a heat dissipation apparatus with heat pipes on a sidewall of the heat exhausting fins to enhance the cooling efficiency.

A further object of the present invention is to utilize the heat plate, the heat column, and the heat pipe to exhaust immediately the heat generated by the CPU.

The present invention provides a heat dissipation apparatus for internal use in a computer. The cooling apparatus comprises a heat sink, at least one heat pipe, a fan, and a plurality heat exhausting fins. The heat sink collects heat energy and the heat pipe connecting with the heat sink to deliver the heat energy along the heat pipe to the heat columns. The heat exhausting fins are positioned on one side of the fan and are coupled with the heat columns. The heat exhausting fins stack together and the heat column passes through the heat exhausting fins. Therefore, the heat column transfers the heat energy to the heat exhausting fins. Further, an outlet airflow of the fan is perpendicular to a normal direction of a surface of at least one heat exhausting fin of the heat exhausting fins and the outlet airflow is parallel to the surfaces of the heat exhausting fins to provide cooling air for the cooling apparatus to carry out the heat energy on the heat exhausting fins.

A heat plate is further connected between the heat pipe and the heat column to deliver heat energy along the heat plate to the heat column and the heat exhausting fins. The heat pipe is fixed on a sidewall of the heat plate. The heat column comprises a circular heat column and the diameter thereof is proportioned to a total thickness of the heat exhausting fins, such as half of the total thickness of the heat exhausting fins.

The heat exhausting fin is made of a highly thermally conductive material and is cut similar to a contour of the fan. The two ends of the heat exhausting fin are turned down about 90 degrees and are horizontally stacked together in vertical direction. The heat exhausting fins and the heat column are made of copper or aluminum.

Therefore, the cooling apparatus according to the present invention can reduce the noise and cost of notebook computers, and enhance the cooling efficiency and yield rate of notebook computers.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 4A is a further preferred embodiment of a heat dissipation apparatus according to the present invention;

FIG. 4B is a front view of the further preferred embodiment of FIG. 4A; and

FIG. 4C is a side view of the further preferred embodiment of FIG. 4A.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1A:
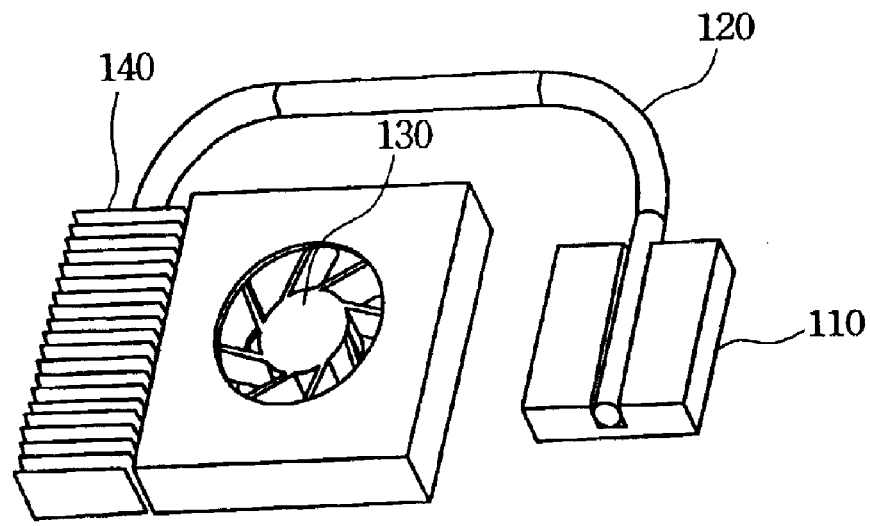
FIG. 1A is a heat dissipation apparatus of a traditional notebook computer.
Figure 1B:
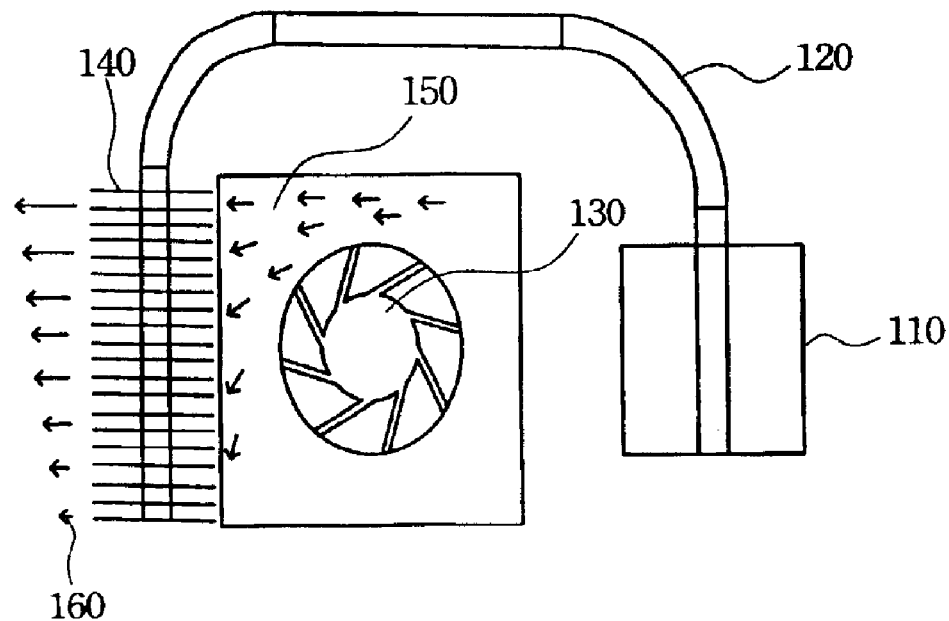
FIG. 1B shows airflow directions of FIG. 1A.
Figure 2A:
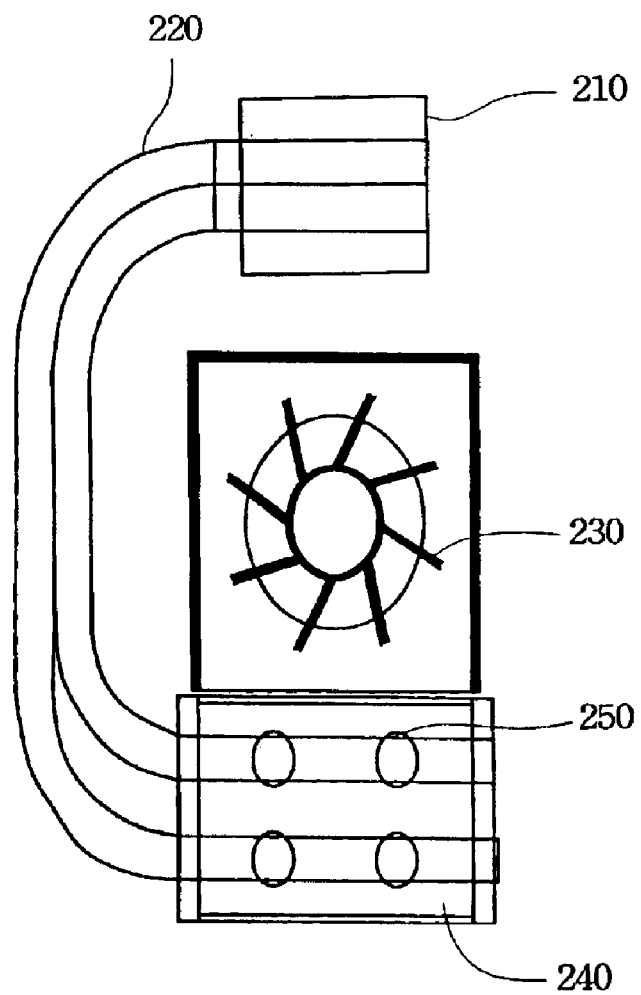
FIG. 2A is a preferred embodiment of a heat dissipation apparatus according to the present invention.

FIG. 2A is a preferred embodiment of a heat dissipation apparatus according to the present invention. The preferred embodiment of the cooling apparatus comprises a heat sink 210, two heat pipes 220, a fan 230, heat exhausting fins 240, and heat columns 250. The heat sink 210 collects the heat energy generated by a CPU, and the heat pipes 220 deliver the heat energy to the heat exhausting fins 240. The present invention further utilizes the heat columns 250 made of highly thermally conductive material to distribute the heat energy to all heat exhausting fins 240. The fan 230 then blows the air through the heat exhausting fins 240 to carry the heat energy out of the notebook computer. In particular, the airflow direction between the outlet of the fan 230 and the inlet of the heat exhausting fins 240 is parallel and in the same stream line.

The heat dissipation apparatus according to the present invention has horizontal heat exhausting fins. The outlet airflow of the fan 230 is perpendicular to the normal direction of the surface of the heat exhausting fins 240. That is to say, the outlet airflow of the fan 230 is parallel to the surfaces of the heat exhausting fins 240. Therefore, there is no included angle between the outlet of the fan 230 and the inlet of the heat exhausting fins 240. The present invention utilizes the horizontal heat exhausting fins to receive the airflow without an included angle, and the noise caused by the turbulence in the heat exhausting fins is subsequently reduced. The present invention effectively reduces the noise of notebook computers.

Figure 2B:
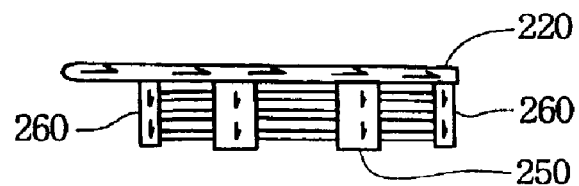
FIG. 2B is a side view of heat exhausting fins and heat pipes according to the preferred embodiment of FIG. 2A.

FIG. 2B is a side view of heat exhausting fins and heat pipes according to the preferred embodiment of FIG. 2A. By way of heat columns 250, the horizontal heat exhausting fins according to the present invention more effectively exhaust the heat energy generated by the CPU. The heat columns 250 deliver the heat energy to every heat exhausting fin 240 more efficiently. The heat columns 250 and sidewall 260 have a thermal conductive capability. The heat pipes 220 connect with the heat column 250 and the sidewall 260. Hence, the heat energy is transferred from the heat pipes 220 to each heat exhausting fin 240 more efficiently. Since the heat columns 250 are made of the highly thermally conductive material such as the copper or aluminum, the heat columns 250 deliver the heat to the heat exhausting fins 240 more efficiently. The materials of the heat exhausting fins and sidewall are also made of highly thermally conductive material such as the copper or aluminum. The material of the present invention is not limited to metal materials or non-metal materials so long as the materials are highly thermally conductive materials, such as copper or aluminum.

The heat columns according to the present invention are not limited to circular columns, diamond columns or triangular columns. All columns can deliver the heat to the heat exhausting fins. The circular column has a lower drag coefficient and the effect is better. The diameter of the circular column is proportional to the total thickness of the heat exhausting fins. A better diameter is about or above a half of the thickness of the heat exhausting fins. If greater than about 5 mm in diameter, the heat columns have good conductive capability, and then the notebook computer with the cooling apparatus according to the present invention has better heat exhausting capability. The heat columns cannot be installed too close the fan, or the columns will be another noise source.

Figure 3A:
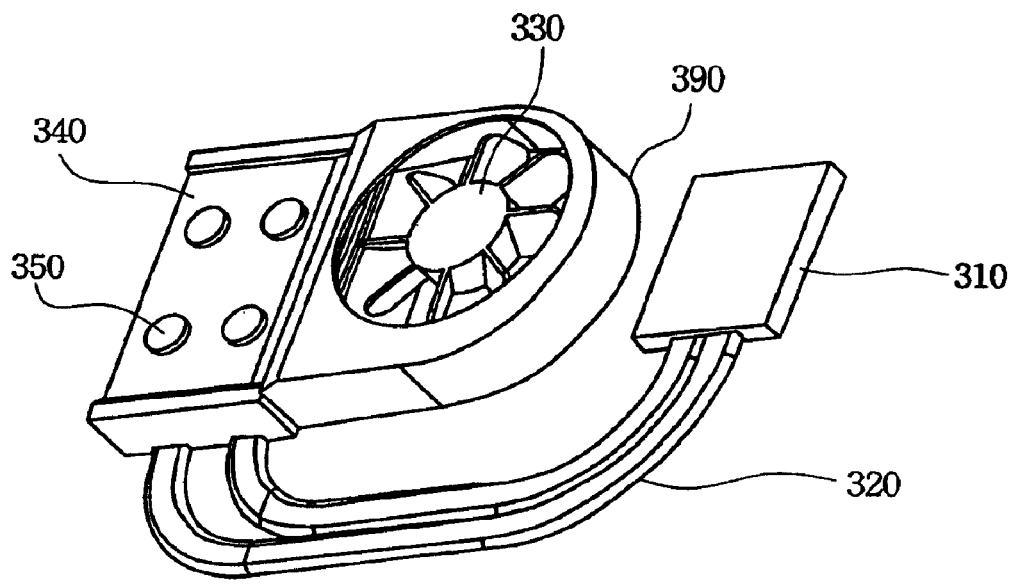
FIG. 3A is another preferred embodiment of a heat dissipation apparatus according to the present invention.

FIG. 3A is another preferred embodiment of a heat dissipation apparatus according to the present invention. As described above, the heat dissipation apparatus comprises a heat sink 310, heat pipes 320, fan 330, heat exhausting fins 340, and heat columns 350. While the CPU is working and generating the heat energy, the heat sink 310 collects the heat energy and the heat pipes 320 transfer to the heat exhausting fins 340 and the heat columns 350. Then, the fan 330 blows the cool air to take out the heat energy. In another preferred embodiment, the fan 330 has only one side inlet to get the fresh air. Therefore, the fan shell 390 has only one side opening. As the drawing shows, the fan 330 sucks the fresh air from the upside and blows the same on to the heat exhausting fins 340. The important difference is that the airflow is not horizontally blown onto the heat exhausting fins 340. Therefore, the inlet of the heat exhausting fins 340 has an upward angle. That is, the fan 330 with a upside inlet blows the air down to the heat exhausting fins 340, and the inlet of the heat exhausting fins 340 has a corresponding angle to receive the air. Therefore, there is no included angle between the airflow of the outlet of the fan 330 and the inlet of the heat exhausting fins 340. The turbulence is reduced and the noise is also reduced.

Figure 3B:
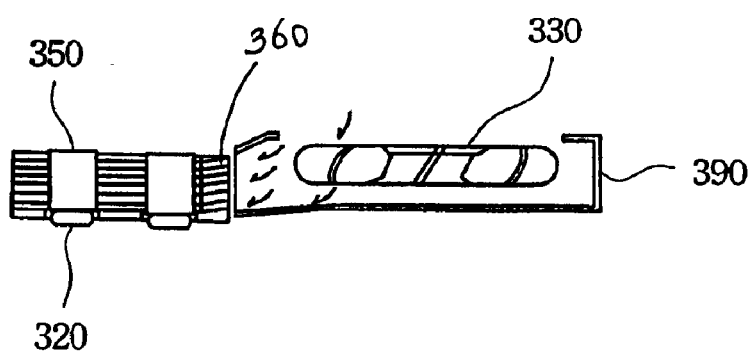
FIG. 3B is a side view of heat exhausting fins, heat pipes and the fan according to another preferred embodiment of FIG. 3A.

FIG. 3B is a side view of heat exhausting fins, heat pipes and the fan according to another preferred embodiment of FIG. 3A. As the drawing shows, the heat exhausting fins 340 are lower than the center of the fan 330 in a vertical direction. The heat exhausting fins 340, with an upward inlet angle 360, create a smooth airflow onto the surface thereof. The heat columns 350 deliver the heat energy transferred from the heat pipes 320 to each exhausting fin 340 and take the heat out by way of the cool air from the fan 330.

FIG. 4A is a further preferred embodiment of a heat dissipation apparatus according to the present invention. As the above description, this preferred embodiment of the heat dissipation apparatus according to the present invention comprises a heat sink 410, heat pipes 420, a fan 430, heat exhausting fins 440, and heat columns 450. The feature of this preferred embodiment is that the heat pipes 420 connect directly to the fan 430 and a heat plate 460 at the sidewall position of the heat exhausting fins 440. Moreover, the heat plate 460 connects with the heat pipes 420, each of the heat exhausting fins 440, and each of the heat columns 450. Therefore, the heat transferred from the heat pipes 420 can be efficiently delivered to the sidewall of the heat exhausting fins 440 and the heat columns 450. The CPU temperature can be reduced faster and the heat can be carried out of the notebook quickly. The shape of the heat exhausting fins 440 is formed similar to the contour of fan 430. Therefore, the heat exhausting fins 440 can be positioned closer to the fan 430. The distance reduction between the fan 430 and the heat exhausting fins 440 makes a higher heat dissipation efficiency and a space reduction.

FIG. 4B is a front view of the preferred embodiment of FIG. 4A. The preferred embodiment utilizes a fan 430 with double inlets at two sides. Therefore, the shell 490 has two inlet openings. The fan 430 blows the fresh air onto the heat exhausting fins in a horizontal direction. The airflow direction is perpendicular to the normal direction of the surface of the heat exhausting fins 440. That is, the outlet direction of the fan 430 is parallel to the surface of the heat exhausting fins 440. There is no included angle between them.

FIG. 4C is a side view of the preferred embodiment of FIG. 4A. The heat pipes 420 connect with the heat plate 460 at the sidewall position of the heat exhausting fins 440. The heat plate 460 has two U-type fillisters to enhance the contact area of the heat plate 460 and the heat pipes 420. The heat plate 460 transfers the heat energy directly to the heat columns 450 and the sidewall of the heat exhausting fins 440 to increase the heat exhausting efficiency. The heat exhausting fin comprises two right angle rims. The heat exhausting fins 440 made of highly thermally conductive material stack together, and are adhered or welded in place; for example, the copper or aluminum heat exhausting fins are welded with tin or joined with thermal adhesive. The heat pipes 420 and the heat plate 460 also utilize tin welding or thermal adhesive for attachment together. Therefore, the heat dissipation apparatus according to the present invention has the advantages of high heat exhausting efficiency and convenient manufacture process.

The heat dissipation apparatus according to the present invention utilizes the same angle of the fan outlet and the heat exhausting fin inlet to reduce the noise of a notebook computer. Further, the heat columns are utilized to distribute the heat to each heat exhausting fin to enhance the heat dissipation efficiency. Furthermore, the heat pipes are located in a sidewall position of the heat exhausting fins to enhance the thermally conductive effect by way of the heat directly transferring to the heat exhausting fins. The heat column and the horizontal heat exhausting fins can reduce the cost of the heat dissipation apparatus and simplify the manufacture process, and especially reduce noise and enhance the quality of the notebook computer.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation apparatus comprising:
   a fan; and
   a plurality heat exhausting fins positioned at one side of the fan, the heat exhausting fins coupling with at least one heat column, the heat exhausting fins being stacked together, the heat column passing through the heat exhausting fins, and the heat column transferring heat energy to the heat exhausting fins, wherein the heat exhausting fins are disposed lower than the fan in a vertical direction and each of the heat exhausting fins comprises an upward inlet angle, wherein an outlet airflow of the fan is perpendicular to a normal direction of a surface o the upward inlet angle of at least one heat exhausting fin of the heat exhausting fins and the outlet airflow is parallel to surfaces of the heat exhausting fins to provide cooling air for the heat dissipation apparatus to carry out the heat energy on the heat exhausting fins.

2. The heat dissipation apparatus of claim 1, wherein the heat column comprises a circular heat column.

3. The heat dissipation apparatus of claim 2, wherein a diameter of the circular heat column is proportional to a total thickness of the heat exhausting fins.

4. The heat dissipation apparatus of claim 3, wherein the diameter of the circular heat column is about one half of the total thickness of the heat exhausting fins.

5. The heat dissipation apparatus of claim 1, wherein each heat exhausting fin is a plate made of a highly thermally conductive material, is cut similar in shape to a contour of the fan, turns down about 90 degrees at two ends thereof, and stacks together with other heat exhausting fins in a vertical direction.

6. The heat dissipation apparatus of claim 1, wherein the heat exhausting fin and the heat column are made of copper.

7. The heat dissipation apparatus of claim 1, wherein the heat exhausting fin and the heat column are made of aluminum.

8. The heat dissipation apparatus of claim 1, wherein the fan includes a single-side inlet fan device.

9. The heat dissipation apparatus of claim 1, wherein the fan includes a double-side inlet fan device.

10. A heat dissipation apparatus for internal use in a computer, the heat dissipation apparatus comprising:
    a heat sink to collect heat energy;
    a fan;
    a plurality of heat exhausting fins positioned at one side of the fan, the heat exhausting fins coupling with at least one heat column, the heat exhausting fins stacking together, the heat column passing through the heat exhausting fins, the heat column transferring the heat energy to the heat exhausting fins, wherein the heat exhausting fins are disposed lower than the fan in a vertical direction and each of the heat exhausting fins comprises an upward inlet angle, wherein an outlet airflow of the fan is perpendicular to a normal direction of a surface of the upward inlet angle of at least one heat exhausting fin of the heat exhausting fins and the outlet airflow is parallel to surfaces of the heat exhausting fins to provide cooling air for the heat dissipation apparatus to carry out the heat energy on the heat exhausting fins; and
    at least one heat pipe connecting between the heat sink and the heat exhausting fins to deliver the heat energy to the heat exhausting fins.

11. The heat dissipation apparatus of claim 10, wherein the cooling apparatus further comprises a heat plate connecting with the heat pipe and the heat column to deliver the heat energy along the heat plate to the heat column and the heat exhausting fins.

12. The heat dissipation apparatus of claim 11, wherein the heat pipe is fixed on a sidewall of the heat plate.

13. The heat dissipation apparatus of claim 10, wherein the heat column comprises a circular heat column.

14. The heat dissipation apparatus of claim 13, wherein diameter of the circular heat column is proportioned to a total thickness of the heat exhausting fins.

15. The heat dissipation apparatus of claim 14, wherein the diameter of the circular heat column is about one half of the total thickness of the heat exhausting fins.

16. The heat dissipation apparatus of claim 10, wherein each heat exhausting fin is a plate is made of a highly thermally conductive material, is cut in shape similar to a contour of the fan, turns down 90 degrees at two ends thereof, and stacks together with other heat exhausting fins in vertical direction.

17. The heat dissipation apparatus of claim 10 wherein the heat exhausting fin and the heat column are made of copper.

18. The heat dissipation apparatus of claim 10 wherein the heat exhausting fin and the heat column are made of aluminum.

* * * * *

UNITED STATES PATENT AND TRADEMARK OFFICE
CERTIFICATE OF CORRECTION

PATENT NO. : 6,867,971 B2
DATED : March 15, 2005
INVENTOR(S) : Chih-Hsi Lai

It is certified that error appears in the above-identified patent and that said Letters Patent is hereby corrected as shown below:

<u>Title page,</u>
Item [73], Assignee, delete "Tiawan (CN)" and insert therefore, -- Taiwan (TW) --.

Signed and Sealed this

Twenty-seventh Day of September, 2005

JON W. DUDAS
*Director of the United States Patent and Trademark Office*